(12) United States Patent
Chen et al.

(10) Patent No.: US 11,606,084 B2
(45) Date of Patent: Mar. 14, 2023

(54) OSCILLATION CIRCUIT, SEMICONDUCTOR DEVICE FOR OSCILLATION CIRCUIT AND METHOD FOR MANUFACTURING THE SAME

(71) Applicant: TAIWAN SEMICONDUCTOR MANUFACTURING COMPANY LTD., Hsinchu (TW)

(72) Inventors: Yung-Shun Chen, Hsinchu (TW); Chih-Chiang Chang, Taipei (TW); Yung-Chow Peng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 97 days.

(21) Appl. No.: 17/019,236

(22) Filed: Sep. 12, 2020

(65) Prior Publication Data
US 2021/0376820 A1 Dec. 2, 2021

Related U.S. Application Data

(60) Provisional application No. 63/030,142, filed on May 26, 2020.

(51) Int. Cl.
| | |
|---|---|
| *H01L 21/8238* | (2006.01) |
| *H01L 29/417* | (2006.01) |
| *H03K 3/03* | (2006.01) |
| *H01L 27/092* | (2006.01) |

(52) U.S. Cl.
CPC ... *H03K 3/0315* (2013.01); *H01L 21/823814* (2013.01); *H01L 27/092* (2013.01); *H01L 29/41775* (2013.01)

(58) Field of Classification Search
CPC .......... H01L 21/823814; H01L 27/092; H01L 29/41725; H01L 29/41775; H03B 2200/0088; H03B 2200/009; H03K 3/0315; H03K 3/0322
USPC .......................................... 331/57
See application file for complete search history.

(56) References Cited

U.S. PATENT DOCUMENTS

| | | | | |
|---|---|---|---|---|
| 4,988,960 | A * | 1/1991 | Tomisawa | H03L 7/0805 331/25 |
| 5,208,557 | A * | 5/1993 | Kersh, III | H03K 3/354 331/74 |
| 6,930,534 | B1 * | 8/2005 | Fu | H03K 19/00384 327/512 |
| 8,330,494 | B2 * | 12/2012 | Uemura | H03K 3/356156 326/103 |
| 2002/0075034 | A1 * | 6/2002 | Schroeder | H01L 27/0266 326/26 |
| 2002/0113660 | A1 * | 8/2002 | Dally | H03L 7/0818 331/135 |
| 2003/0214361 | A1 * | 11/2003 | Nishikido | H03K 3/0315 331/57 |

(Continued)

*Primary Examiner* — Levi Gannon
(74) *Attorney, Agent, or Firm* — WPAT Law; Anthony King

(57) ABSTRACT

An oscillation circuit is provided. The oscillation circuit includes a first inverting circuit. The first inverting circuit comprises a first transistor of a first type and a second transistor of the first type, wherein a gate terminal of the first transistor is connected to a gate terminal of the second transistor, and a source terminal of the first transistor is connected to a drain terminal of the second transistor.

21 Claims, 13 Drawing Sheets

(56) References Cited

U.S. PATENT DOCUMENTS

| | | | |
|---|---|---|---|
| 2005/0128011 A1* | 6/2005 | Wakii | H03K 3/0322 |
| | | | 331/57 |
| 2007/0063288 A1* | 3/2007 | Furuta | H01L 27/0207 |
| | | | 257/E27.098 |
| 2010/0044755 A1* | 2/2010 | Tsuda | H01L 27/0928 |
| | | | 257/E27.06 |
| 2010/0157669 A1* | 6/2010 | Audzeyeu | H01L 27/11558 |
| | | | 365/185.15 |
| 2017/0117795 A1* | 4/2017 | Schrom | G06F 1/26 |
| 2019/0028089 A1* | 1/2019 | R R | H03K 5/04 |
| 2020/0194418 A1* | 6/2020 | Mun | H01L 27/0924 |

* cited by examiner

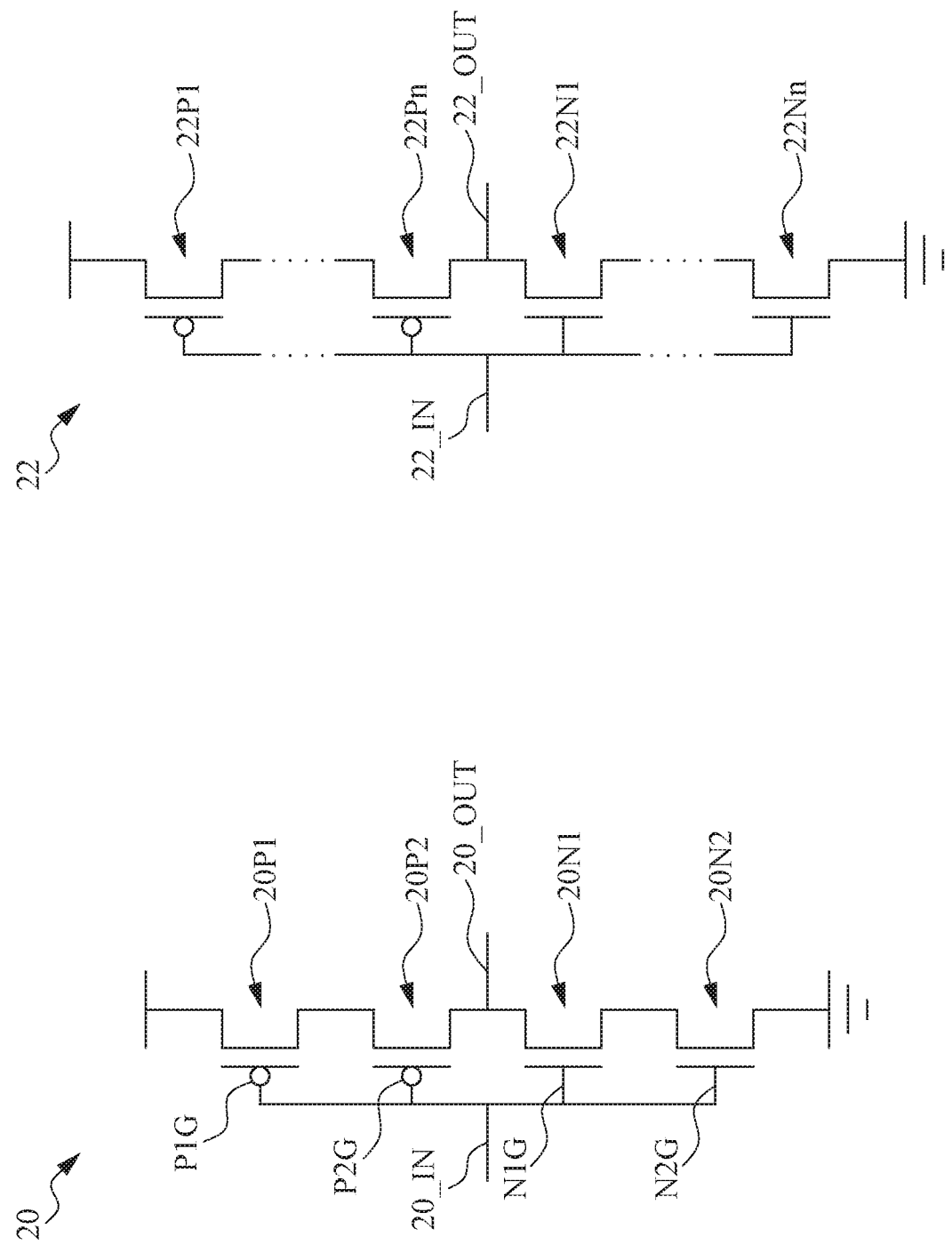

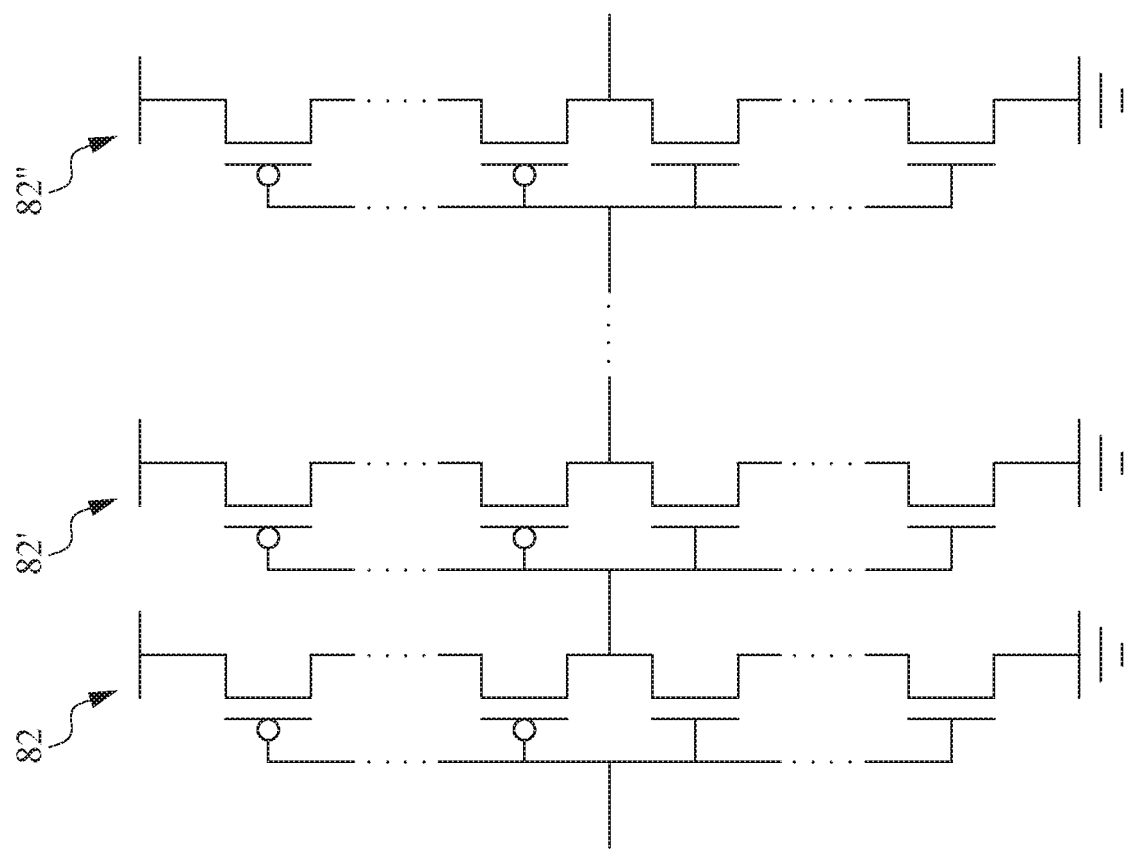

OSCILLATION CIRCUIT, SEMICONDUCTOR DEVICE FOR OSCILLATION CIRCUIT AND METHOD FOR MANUFACTURING THE SAME

PRIORITY CLAIM AND CROSS-REFERENCE

This application claims the benefit of prior-filed provisional application No. 63/030,142, filed on 26 May 2020.

BACKGROUND

Existing clock source generators, such as ring-oscillators or phase-lock loop (PLL) circuits, suffer from device noise imperfection, which limits the performance of such clock source generators. To fulfill low noise demand, ring oscillators including LC-tanks (inductors and varactors) are commonly used, and sometimes additional phase noise filter blocks are also included. Inductors and varactors are area consuming and sensitive to process variations. As a result, ring oscillators including LC-tanks or additional phase noise filter blocks will either suffer from on-die variations, or require extra complex design efforts.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 2A illustrates a schematic view of an inverting circuit that can be used as a delay unit, in accordance with some embodiments of the present disclosure.

FIG. 2B illustrates a schematic view of an inverting circuit that can be used as a delay unit, in accordance with some embodiments of the present disclosure.

FIG. 9A illustrates a schematic view of a plurality of connected inverting circuits, in accordance with some embodiments of the present disclosure.

DETAILED DESCRIPTION

Figure 1:
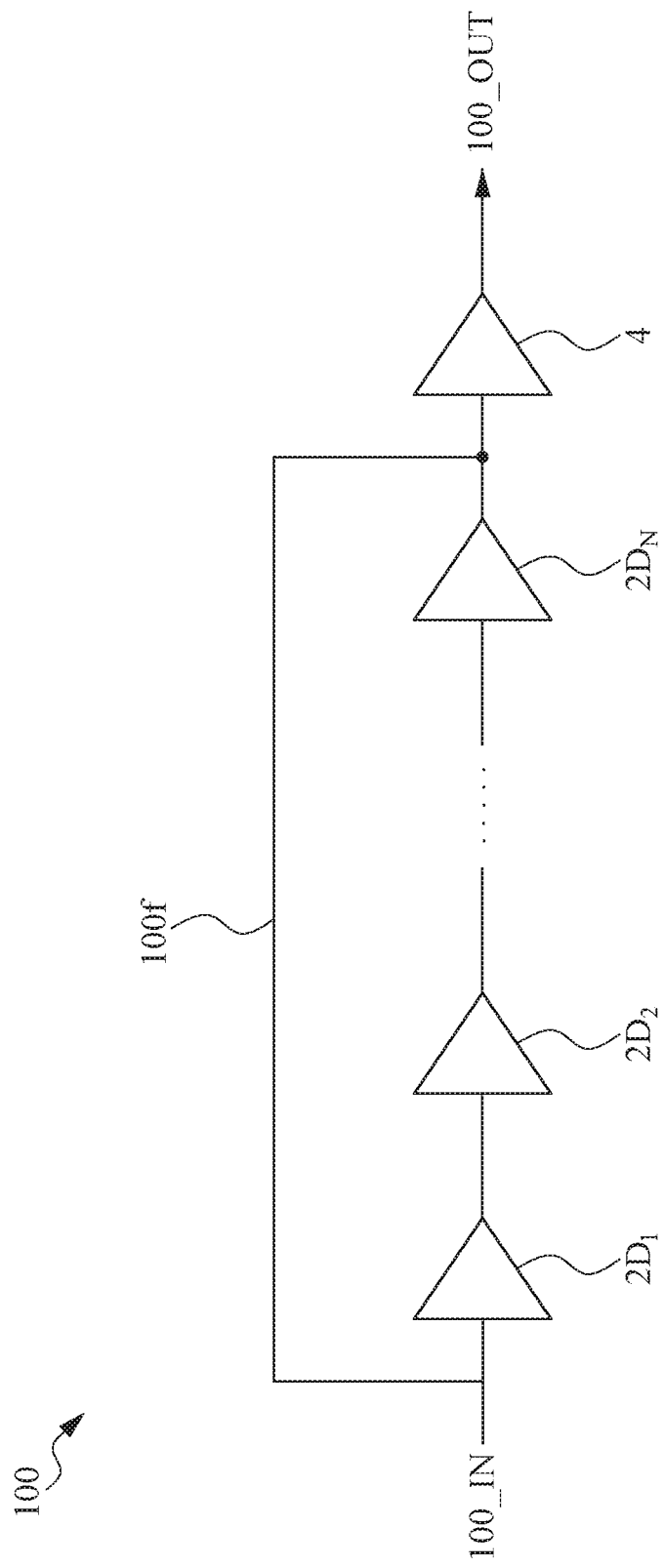
FIG. 1 illustrates a schematic view of a ring oscillator (RO), in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A methodology for reducing phase noise of ring oscillators is proposed. The proposed methodology is able to achieve low noise benefit without adopting complex circuit structures. In addition, the proposed methodology is friendly to Fin Field-Effect Transistor (FinFET) technologies.

FIG. 1 illustrates a schematic view of a ring oscillator (RO), in accordance with some embodiments of the present disclosure. The RO 100 includes an input terminal 100_IN, an output terminal 100_OUT, and several delay units connected in series. The RO 100 may include delay units $2D_1$, $2D_2$, ... $2D_N$. The delay units $2D_1$, $2D_2$, ... $2D_N$ can also be referred to as delay circuits, delay cells, delay blocks or delay devices in subsequent paragraphs of the present disclosure. The delay units $2D_1$, $2D_2$, ... $2D_N$ can be connected in series. The number N is a positive integer. In some embodiments, the number N can be an odd positive integer. The delay unit $2D_1$ can be connected to the delay unit $2D_N$ by a feedback loop 100f. The input terminal of the delay unit $2D_1$ can be connected to the output terminal of the delay unit $2D_N$ by a feedback loop 100f.

The output terminal of the delay unit $2D_N$ can be connected to a buffering unit 4. The buffering unit 4 can also be referred to as a buffer, a buffering circuit, a buffering block or a buffering device in subsequent paragraphs of the present disclosure. The buffering unit 4 may adjust the amplitude of the signals provided by the delay unit $2D_N$ before the RO 100 provides those signals to the circuits of the next stage. The buffering unit 4 may adjust the amplitude of the current/voltage provided by the delay unit $2D_N$.

The RO 100 can be a voltage-controlled oscillator (VCO) or a current-controlled oscillator (CCO). The frequency of the signals provided by the output terminal 100_OUT can be calculated in accordance with the equation below:

$$\text{freq} = 1/(2 * N * Td) \quad \text{(equation 1)}$$

In equation 1, N is the number of the delay units and Td is the delay time of each of the delay units $2D_1$, $2D_2$, ... $2D_N$. Phase noise of the RO 100 can be measured from the signals outputted by the output terminal 100_OUT in frequency domain. In general, phase noise is defined as the ratio of the noise in a 1-Hz bandwidth at a specified frequency offset, $f_m$, to the oscillator signal amplitude at frequency $f_O$.

FIG. 2A illustrates a schematic view of an inverting circuit that can be used as a delay unit, in accordance with some embodiments of the present disclosure. FIG. 2A shows an inverting circuit 20. The inverting circuit 20 can also be referred to as an inverter, an inverting unit, an inverting block or an inverting device in subsequent paragraphs of the present disclosure. The inverting circuit 20 includes transistors 20P1 and 20P2 of the same type. The inverting circuit 20 includes transistors 20N1 and 20N2 of another type. In some embodiments, the transistors 20P1 and 20P2 can be a p-type Metal-Oxide-Semiconductor Field-Effect Transistor (MOSFET). In some embodiments, the transistors 20N1 and 20N2 can be an n-type MOSFET.

The gate terminal P1G of the transistor 20P1 is connected to the gate terminal P2G of the transistor 20P2. The gate terminal N1G of the transistor 20N1 is connected to the gate terminal N2G of the transistor 20N2. The gate terminal P1G of the transistor 20P1, the gate terminal P2G of the transistor 20P2, the gate terminal N1G of the transistor 20N1 and the gate terminal N2G of the transistor 20N2 are connected together. The configuration shown in FIG. 2A can be called a stack-gate structure.

The source terminal of the transistor 20P1 is connected to the drain terminal of the transistor 20P2. The source terminal of the transistor 20P2 is connected to the drain terminal of the transistor 20N1. The source terminal of the transistor 20N1 is connected to the drain terminal of the transistor 20N2.

The inverting circuit 20 includes an input terminal 20_IN and an output terminal 20_OUT. In the operations of the inverting circuit 20, a delay may occur when signals are transmitted from the input terminal 20_IN to the output terminal 20_OUT. Therefore, the inverting circuit 20 can be used as a delay unit. In some embodiments, the delay units $2D_1$, $2D_2$, ... $2D_N$ shown in FIG. 1 can be implemented using the inverting circuit 20.

The inverting circuit 20 including a stack-gate structure can have a reduced noise current. The inverting circuit 20 including a stack-gate structure can have a significantly-reduced flicker noise. The stack-gate structure of the inverting circuit 20 can reduce the flicker noise of a ring oscillator. A ring oscillator that includes a delay unit implemented with a stack-gate structure can have a significantly-reduced flicker noise.

A theoretical derivation will be provided below on how the stack-gate structure helps to reduce the noise current. Assume that a single transistor T1 is operating at a frequency f. The noise current $i_{n0}^2$ of the single transistor T1 can be expressed in accordance with the equation below:

$$i_{n0}^2 = \frac{Kgm^2}{WLC_{ox}f} \quad \text{(equation 2)}$$

The parameter K in the above equation is the conduction parameter of the transistor T1. The parameter W is the gate width of the transistor T1. The parameter L is the gate length of the transistor T1. The parameter $C_{ox}$ is the oxide capacitance of the transistor T1. The parameter gm is the transconductance of the transistor T1.

Next, if one additional transistor T2 is connected with the transistor T1 as a stack-gate structure, the noise voltage $v_{n1}^2$ of the stack-gate structure can be expressed in accordance with the equation below:

$$v_{n1}^2 = \frac{K}{WLC_{ox}f} \quad \text{(equation 3)}$$

The noise current $i_{n1}^2$ of the stack-gate structure can be expressed in accordance with the equations below:

$$i_{n1}^2 = \frac{v_{n1}^2}{R_{on}^2} = \frac{K}{R_{on}^2 WLC_{ox}f} \quad \text{(equation 4)}$$

$$\frac{K}{R_{on}^2 WLC_{ox}f} = \frac{Kgm^2}{(R_{on}^2 WLC_{ox}f)gm^2} = \frac{i_{n0}^2}{gm^2 R_{on}^2} \quad \text{(equation 5)}$$

The parameter $R_{on}$ in the above equations is the active/turn-on resistance of the additional transistor T2. Based on the equations 4 and 5, it is clear that the noise current $i_{n1}^2$ of the stack-gate structure can be the noise current $i_{n0}^2$ of the single transistor T1 divided by a value $gm^2 R_{on}^2$. Since the value $gm^2 R_{on}^2$ is positive and greater than one, the noise current $i_{n1}^2$ is lower than the noise current $i_{n0}^2$.

In addition, experiment results will also show that an inverting circuit that includes a stack-gate structure can have a significantly-reduced noise current spectral density (Sid, $A^2/Hz$). The experiment results will be later discussed in accordance with FIGS. 3A and 3B.

FIG. 2B illustrates a schematic view of an inverting circuit that can be used as a delay unit, in accordance with some embodiments of the present disclosure. FIG. 2B shows an inverting circuit 22. The inverting circuit 22 can also be referred to as an inverter, an inverting unit, an inverting block or an inverting device in subsequent paragraphs of the present disclosure. The inverting circuit 22 includes transistors 22P1, 22P2 (not shown), . . . and 22Pn of the same type. The inverting circuit 22 includes transistors 22N1, 22N2 (not shown), . . . and 22Nn of another type. In some embodiments, the transistors 22P1, 22P2, . . . and 22Pn can be p-type MOSFETs. In some embodiments, the transistors 22N1, 22N2, . . . and 22Nn can be n-type MOSFETs. The number "n" is a positive integer.

Similar to the inverting circuit 20, the inverting circuit 22 includes a stack-gate structure. That is, the gate terminals of the transistors 22P1, 22P2, . . . and 22Pn are connected together, and the gate terminals of the transistors 22N1, 22N2, . . . and 22Nn are connected together. In addition, the gate terminals of the transistors 22P1, 22P2, . . . and 22Pn are connected to the gate terminals of the transistors 22N1, 22N2, . . . and 22Nn.

The inverting circuit 22 includes an input terminal 22_IN and an output terminal 22_OUT. In the operations of the inverting circuit 22, a delay may occur when signals are transmitted from the input terminal 22_IN to the output terminal 22_OUT. Therefore, the inverting circuit 22 can be used as a delay unit. In some embodiments, the delay units $2D_1, 2D_2, \ldots 2D_N$ shown in FIG. 1 can be implemented using the inverting circuit 22.

The inverting circuit 22 including a stack-gate structure can have a significantly-reduced flicker noise. The stack-gate structure of the inverting circuit 22 can reduce the flicker noise of a ring oscillator. A ring oscillator that includes a delay unit implemented with a stack-gate structure can have a significantly-reduced flicker noise. An experiment result shows that an inverting circuit that includes a stack-gate structure can have a significantly-reduced noise current spectral density (Sid, $A^2/Hz$). The experiment results will be later discussed in accordance with FIGS. 3A and 3B.

Figure 3A:
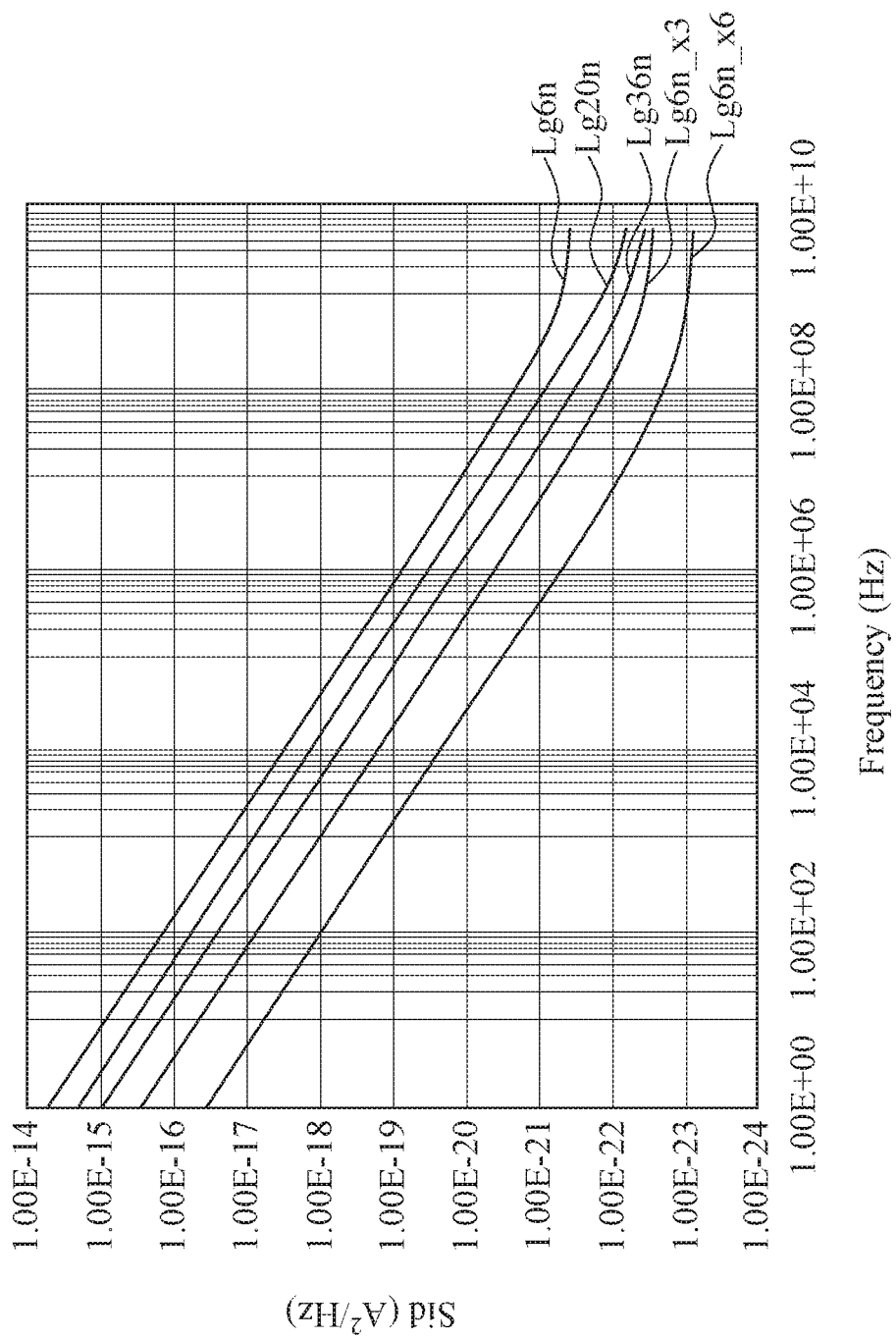
FIG. 3A illustrates a diagram including the noise current spectral density of various circuit structures, in accordance with some embodiments of the present disclosure.

FIG. 3A illustrates a diagram including the noise current spectral density of various circuit structures, in accordance with some embodiments of the present disclosure.

FIG. 3A shows the noise current spectral density of several different circuits. FIG. 3A shows five different circuit structures tested under an n-type MOSFET standard threshold voltage. The horizontal axis is the frequency in which each of the circuits operates, in the unit of Herts (Hz). The vertical axis is the noise current spectral density of the circuits in different operating frequencies, in the unit of $A^2/Hz$, in which "A" means ampere.

The curve labeled as "Lg6n" is the noise current spectral density of a single n-type MOSFET having a gate channel length of 6 nanometers (nm). The curve labeled as "Lg20n" is the noise current spectral density of a single n-type MOSFET having a gate channel length of 20 nm. The curve labeled as "Lg36n" is the noise current spectral density of a single n-type MOSFET having a gate channel length of 36 nm.

The curve labeled as "Lg6n_x3" is the noise current spectral density of three n-type MOSFETs connected in a stack-gate structure, and each has a gate channel length of 6 nm. The curve labeled as "Lg6n_x6" is the noise current spectral density of six n-type MOSFETs connected in a stack-gate structure, and each has a gate channel length of 6 nm.

Referring to FIG. 3A, it is found that a single n-type MOSFET can have a lower noise if it has a greater gate channel length. For example, the curve labeled as "Lg36n" is in general lower than the curve labeled as "Lg20n," and the curve labeled as "Lg20n" is in general lower than the curve labeled as "Lg6n." Nevertheless, it can be found in FIG. 3A that several n-type MOSFETs having a smaller gate channel length can—if connected as a stack-gate structure—have a lower noise compared to a single n-type MOSFET that has a greater gate channel length.

For example, the curve labeled as "Lg6n_x3" is in general lower than the curve labeled as "Lg20n," and the curve labeled as "Lg6n_x6" is in general lower than the curve labeled as "Lg36n." The curve labeled as "Lg6n_x3" is compared with the curve labeled as "Lg20n," since they can be deemed as having similar gate channel lengths (that is, 18 nm versus 20 nm). The curve labeled as "Lg6n_x6" is compared with the curve labeled as "Lg36n," since they can be deemed as having equivalent gate channel lengths (that is, 36 nm).

Table 1 below shows the noise current spectral density (Sid) measured at 1 M Hz for each of the circuit structures labeled as "Lg6n," "Lg20n," "Lg36n," "Lg6n_x3" and "Lg6n_x6." Referring to Table 1, the Sid of the circuit structure labeled as "Lg36n" measured at 1 MHz is lower than that of the circuit structure labeled as "Lg20n," and the Sid of the circuit structure labeled as "Lg20n" measured at 1 MHz is lower than that of the circuit structure labeled as "Lg6n."

TABLE 1

| | Circuit structure | | | | |
|---|---|---|---|---|---|
| | Lg6n | Lg20n | Lg36n | Lg6n_x3 | Lg6n_x6 |
| Sid at 1 MHz | 7.20 × $10^{-20}$ | 3.23 × $10^{-20}$ | 1.27 × $10^{-20}$ | 4.02 × $10^{-21}$ | 5.12 × $10^{-22}$ |

In addition, the Sid of the circuit structure labeled as "Lg6n_x3" measured at 1 MHz is lower than that of the circuit structure labeled as "Lg20n." According to the measurements, the Sid of the circuit structure labeled as "Lg6n_x3" is approximately 87.54% less than that of the Sid of the circuit structure labeled as "Lg20n." In addition, the Sid of the circuit structure labeled as "Lg6n_x6" is approximately 95.98% less than that of the Sid of the circuit structure labeled as "Lg36n."

Figure 3B:
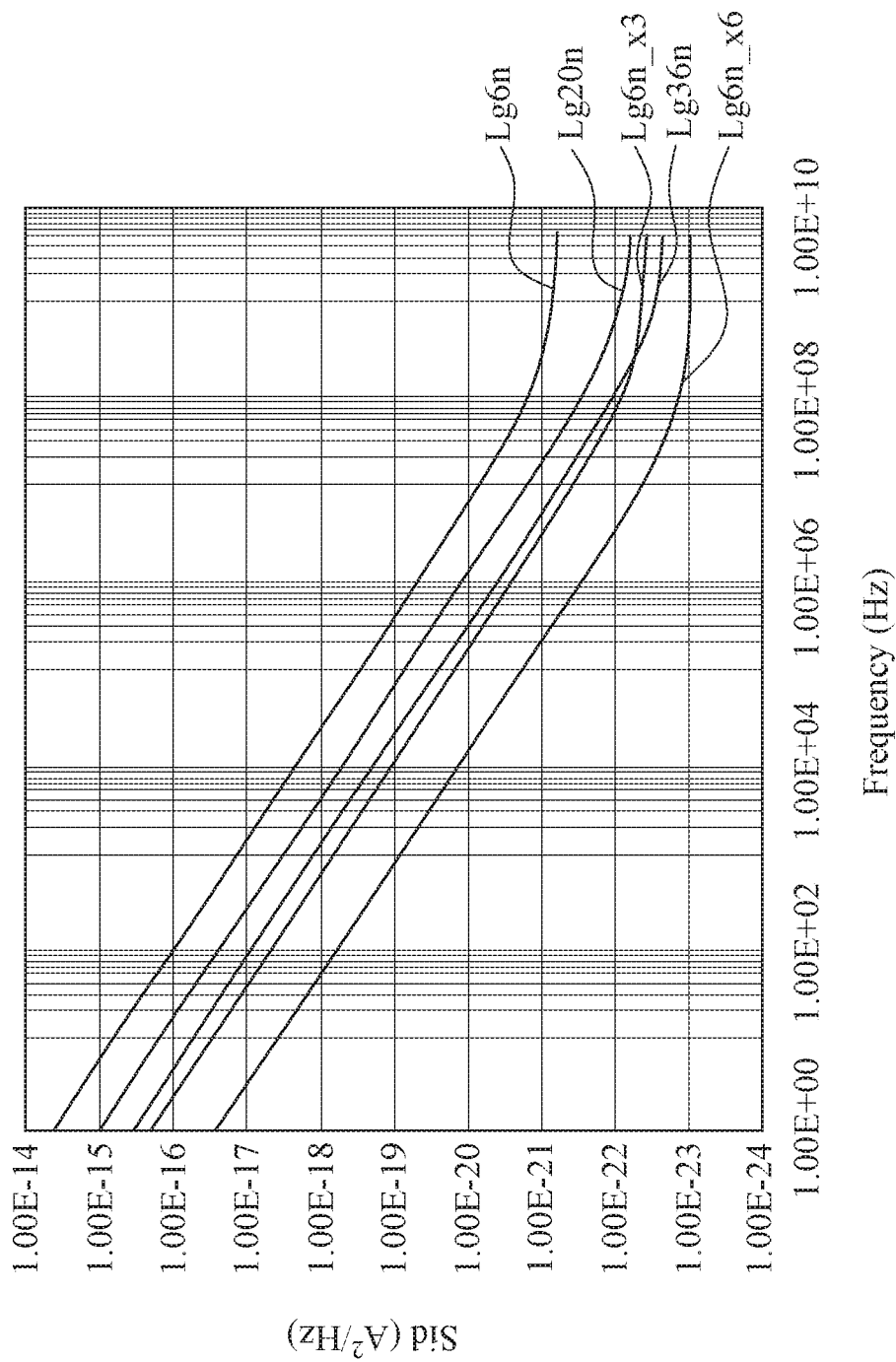
FIG. 3B illustrates a diagram including the noise current spectral density of various circuit structures, in accordance with some embodiments of the present disclosure.

FIG. 3B illustrates a diagram including the noise current spectral density of various circuit structures, in accordance with some embodiments of the present disclosure.

FIG. 3B shows the noise current spectral density of several different circuits. FIG. 3B shows five different circuit structures tested under a p-type MOSFET standard threshold voltage. The horizontal axis is the frequency in which each of the circuits operates, in the unit of Hz. The vertical axis is the noise current spectral density of the circuits in different operating frequencies, in the unit of $A^2/Hz$.

The curve labeled as "Lg6n" is the noise current spectral density of a single p-type MOSFET having a gate channel length of 6 nm. The curve labeled as "Lg20n" is the noise current spectral density of a single p-type MOSFET having a gate channel length of 20 nm. The curve labeled as "Lg36n" is the noise current spectral density of a single p-type MOSFET having a gate channel length of 36 nm.

The curve labeled as "Lg6n_x3" is the noise current spectral density of three p-type MOSFETs connected in a stack-gate structure, and each has a gate channel length of 6 nm. The curve labeled as "Lg6n_x6" is the noise current spectral density of six p-type MOSFETs connected in a stack-gate structure, and each has a gate channel length of 6 nm.

Referring to FIG. 3B, it is found that a single p-type MOSFET can have a lower noise if it has a greater gate channel length. For example, the curve labeled as "Lg36n" is in general lower than the curve labeled as "Lg20n," and the curve labeled as "Lg20n" is in general lower than the curve labeled as "Lg6n." Nevertheless, it can be found in FIG. 3B that several p-type MOSFETs having a smaller gate channel length can—if connected as a stack-gate structure—have a lower noise compared to a single p-type MOSFET that has a greater gate channel length.

For example, the curve labeled as "Lg6n_x3" is in general lower than the curve labeled as "Lg20n," and the curve labeled as "Lg6n_x6" is in general lower than the curve labeled as "Lg36n." The curve labeled as "Lg6n_x3" is compared with the curve labeled as "Lg20n," since they can be deemed as having similar gate channel lengths (that is, 18 nm versus 20 nm). The curve labeled as "Lg6n_x6" is compared with the curve labeled as "Lg36n," since they can be deemed as having equivalent gate channel lengths (that is, 36 nm).

Table 2 below shows the noise current spectral density (Sid) measured at 1 MHz for each of the circuit structures labeled as "Lg6n," "Lg20n," "Lg36n," "Lg6n_x3" and "Lg6n_x6." Referring to Table 2, the Sid of the circuit structure labeled as "Lg36n" measured at 1 MHz is lower than that of the circuit structure labeled as "Lg20n," and the Sid of the circuit structure labeled as "Lg20n" measured at 1 MHz is lower than that of the circuit structure labeled as "Lg6n."

TABLE 2

| | Circuit structure | | | | |
|---|---|---|---|---|---|
| | Lg6n | Lg20n | Lg36n | Lg6n_x3 | Lg6n_x6 |
| Sid at 1 MHz | $4.34 \times 10^{-20}$ | $1.21 \times 10^{-20}$ | $3.44 \times 10^{-21}$ | $2.23 \times 10^{-21}$ | $2.82 \times 10^{-22}$ |

In addition, the Sid of the circuit structure labeled as "Lg6n_x3" measured at 1 MHz is lower than that of the circuit structure labeled as "Lg20n." According to the measurements, the Sid of the circuit structure labeled as "Lg6n_x3" is approximately 81.61% less than that of the Sid of the circuit structure labeled as "Lg20n." In addition, the Sid of the circuit structure labeled as "Lg6n_x6" is approximately 91.79% less than that of the Sid of the circuit structure labeled as "Lg36n."

Figure 4:
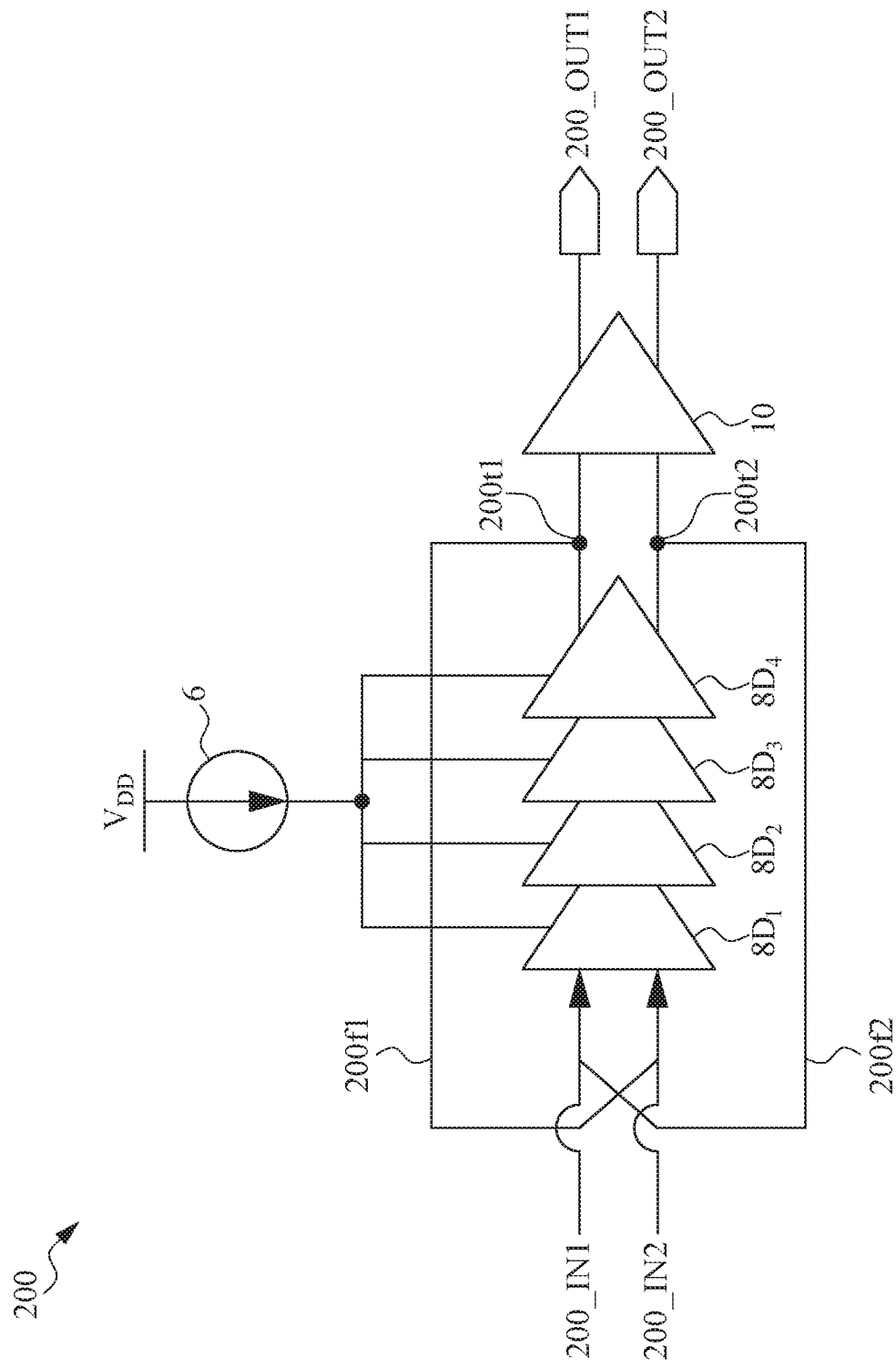
FIG. 4 illustrates a schematic view of an oscillator, in accordance with some embodiments of the present disclosure.

FIG. 4 illustrates a schematic view of an oscillator, in accordance with some embodiments of the present disclosure. FIG. 4 shows an oscillator 200. The oscillator 200 can be a current control oscillator (CCO). The oscillator 200 can also be referred to as an oscillation circuit, an oscillation unit, an oscillation block or an oscillation device in subsequent paragraphs of the present disclosure.

The oscillator 200 includes four delay units $8D_1$, $8D_2$, $8D_3$ and $8D_4$. The delay units $8D_1$, $8D_2$, $8D_3$ and $8D_4$ can be connected in series. Each of the delay units $8D_1$, $8D_2$, $8D_3$ and $8D_4$ can be connected to a current source 6. The current source 6 can be connected to a supply voltage $V_{DD}$. The oscillator 200 includes two input terminals 200_IN1 and 200_IN2. The oscillator 200 further includes two output terminals 200_OUT1 and 200_OUT 2. The internal terminal 200$t$1 can be connected to the input terminal 200_IN2 through a feedback loop 200$f$1. The internal terminal 200$t$2 can be connected to the input terminal 200_IN1 through a feedback loop 200$f$2.

The output terminals of the delay unit $8D_4$ can be connected to a buffering unit 10. The buffering unit 10 can also be referred to as a buffer, a buffering circuit, a buffering block, or a buffering device in subsequent paragraphs of the present disclosure. The buffering unit 10 may adjust the amplitude of the signals provided by the delay unit $8D_4$ before the oscillator 200 provides those signals to the circuits of the next stage. The buffering unit 10 may adjust the amplitude of the current/voltage provided by the delay unit $8D_4$.

Figure 5:
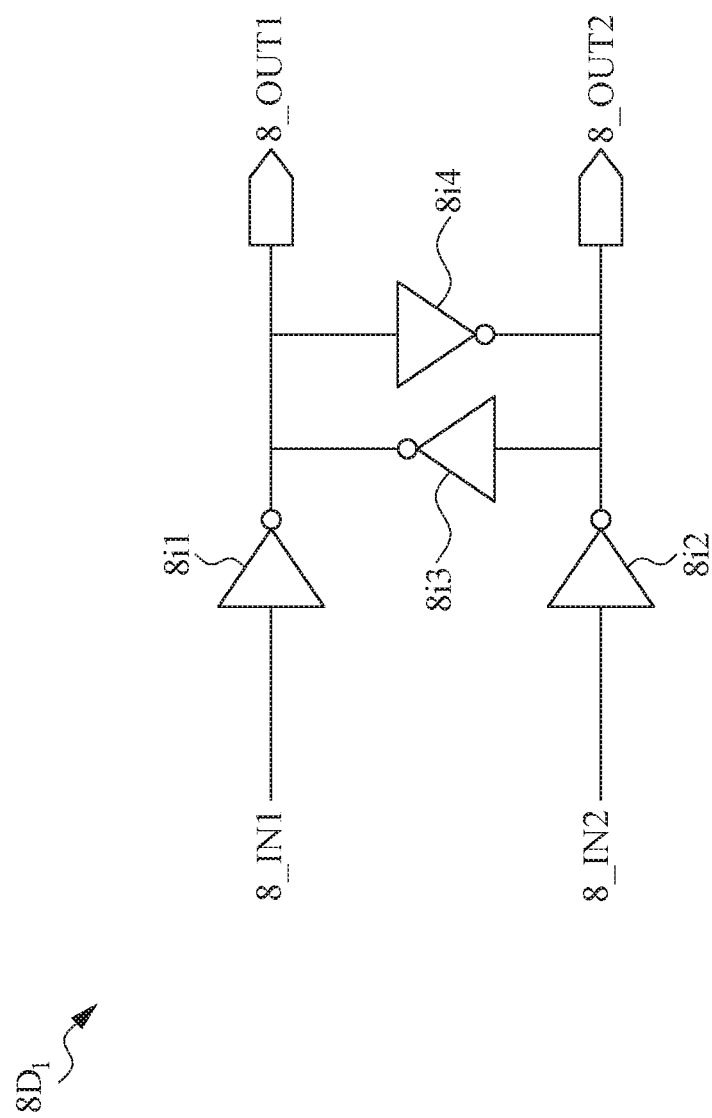
FIG. 5 illustrates a schematic view of a delay unit, in accordance with some embodiments of the present disclosure.

FIG. 5 illustrates a schematic view of a delay unit, in accordance with some embodiments of the present disclosure. FIG. 5 shows an exemplary embodiment of the delay unit $8D_1$. In some embodiments, the delay units $8D_2$, $8D_3$ or $8D_4$ and of the oscillator 200 can have a structure similar to that shown in FIG. 5.

The delay unit $8D_1$ includes inverting circuits $8i$1, $8i$2, $8i$3 and $8i$4. Each of the inverting circuits $8i$1, $8i$2, $8i$3 and $8i$4 can also be referred to as an inverter, an inverting unit, an inverting device, or an inverting block in the subsequent paragraphs of the present disclosure.

Referring to FIG. 5, the delay unit $8D_1$ includes two input terminals 8_IN1 and 8_IN2. In addition, the delay unit $8D_1$ includes two output terminals 8_OUT1 and 8_OUT2.

The output terminal of the inverting circuit $8i$1 can be connected to the output terminal of the inverting circuit $8i$3. The output terminal of the inverting circuit $8i$1 can be connected to the input terminal of the inverting circuit $8i$4. The output terminal of the inverting circuit $8i$2 can be connected to the input terminal of the inverting circuit $8i$3. The output terminal of the inverting circuit $8i$2 can be connected to the output terminal of the inverting circuit $8i$4.

The inverting circuit $8i$1 can include MOSFETs having an aspect ratio of AR1. The inverting circuit $8i$2 can include MOSFETs having an aspect ratio of AR2. The inverting circuit $8i$3 can include MOSFETs having an aspect ratio of AR3. The inverting circuit $8i$4 can include MOSFETs having an aspect ratio of AR4. In some embodiments, the aspect ratio AR1 can be substantially identical to the aspect ratio AR2. In some embodiments, the aspect ratio AR3 can be substantially identical to the aspect ratio AR4.

In some embodiments, the aspect ratio AR1 can be different from the aspect ratio AR3. In some embodiments, the aspect ratio AR1 can be different from the aspect ratio AR4.

In some embodiments, the aspect ratio AR2 can be different from the aspect ratio AR3. In some embodiments, the aspect ratio AR2 can be different from the aspect ratio AR4. In some embodiments, the aspect ratio AR1 can be greater than the aspect ratio AR3. In some embodiments, the aspect ratio AR1 can be greater than the aspect ratio AR4. In some embodiments, the aspect ratio AR2 can be greater than the aspect ratio AR3. In some embodiments, the aspect ratio AR2 can be greater than the aspect ratio AR4.

In some embodiments, the aspect ratio AR3 can range approximately from 0.25~0.5 times the aspect ratio AR1. In some embodiments, the aspect ratio AR4 can range approximately from 0.25~0.5 times the aspect ratio AR1. In some embodiments, the aspect ratio AR3 can range approximately from 0.25~0.5 times the aspect ratio AR2. In some embodiments, the aspect ratio AR4 can range approximately from 0.25~0.5 times the aspect ratio AR2.

In some embodiments, the aspect ratio AR3 can range approximately from 0.15~0.75 times the aspect ratio AR1. In some embodiments, the aspect ratio AR4 can range approximately from 0.15~0.75 times the aspect ratio AR1. In some embodiments, the aspect ratio AR3 can range approximately from 0.15~0.75 times the aspect ratio AR2. In some embodiments, the aspect ratio AR4 can range approximately from 0.15~0.75 times the aspect ratio AR2.

The inverting circuit 8$i$1 provides a delay time when a signal is transmitted from the input terminal 8_IN1 to the output terminal 8_OUT1. The inverting circuit 8$i$2 provides a delay time when a signal is transmitted from the input terminal 8_IN2 to the output terminal 8_OUT2. The inverting circuits 8$i$3 and 8$i$4 are connected as a latch structure. The inverting circuit 8$i$3 connected between the output terminals 8_OUT1 may make the signal of the 8_OUT1 to be an inverted version of the signal of the 8_OUT2. The inverting circuit 8$i$4 connected between the output terminals 8_OUT1 may make the signal of the 8_OUT2 to be an inverted version of the signal of the 8_OUT1.

Figure 6B:
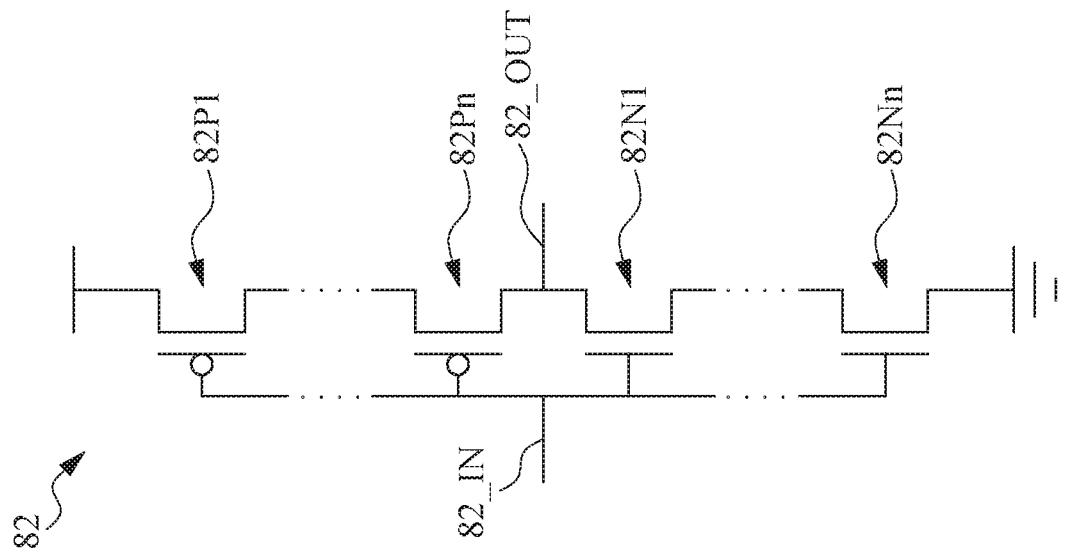
FIG. 6B illustrates a schematic view of an inverting circuit that can be used as a delay unit, in accordance with some embodiments of the present disclosure.
Figure 6A:
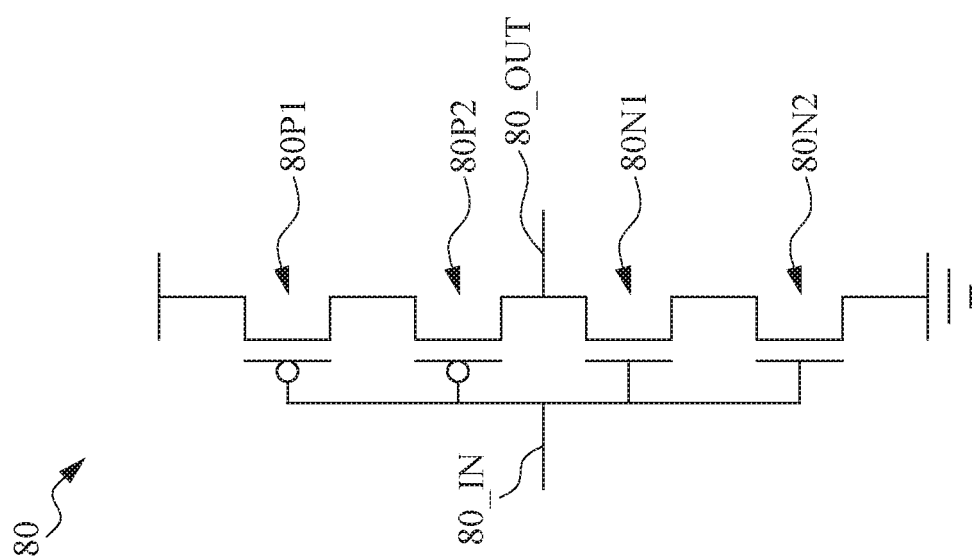
FIG. 6A illustrates a schematic view of an inverting circuit that can be used as a delay unit, in accordance with some embodiments of the present disclosure.

FIG. 6A illustrates a schematic view of an inverting circuit that can be used as a delay unit, in accordance with some embodiments of the present disclosure.

FIG. 6A shows an inverting circuit 80. The inverting circuit 80 can also be referred to as an inverter, an inverting unit, an inverting block or an inverting device in subsequent paragraphs of the present disclosure. The inverting circuit 80 includes transistors 80P1 and 80P2 of the same type. The inverting circuit 80 includes transistors 80N1 and 80N2 of another type. In some embodiments, the transistors 80P1 and 80P2 can be p-type MOSFETs. In some embodiments, the transistors 80N1 and 80N2 can be n-type MOSFETs.

The transistors 80P1, 80P2, 80N1 and 80N2 are connected in a manner similar to that of the inverting circuit 20 shown in FIG. 2A. The configuration of the inverting circuit 80 can be called a stack-gate structure.

The inverting circuit 80 includes an input terminal 80_IN and an output terminal 80_OUT. In some embodiments, the inverting circuits 8$i$1, 8$i$2, 8$i$3 and 8$i$4 shown in FIG. 5 can be implemented using the inverting circuit 80.

The inverting circuit 80 including a stack-gate structure can have a significantly-reduced flicker noise. The stack-gate structure of the inverting circuit 80 can reduce the flicker noise of a ring oscillator. A ring oscillator that includes a delay unit implemented with a stack-gate structure can have a significantly-reduced flicker noise. An experiment result shows that an inverting circuit that includes a stack-gate structure can have a significantly-reduced noise current spectral density (Sid, A$^2$/Hz).

FIG. 6B illustrates a schematic view of an inverting circuit that can be used as a delay unit, in accordance with some embodiments of the present disclosure. FIG. 6B shows an inverting circuit 82. The inverting circuit 82 can also be referred to as an inverter, an inverting unit, an inverting block or an inverting device in subsequent paragraphs of the present disclosure. The inverting circuit 82 includes transistors 82P1, 82P2 (not shown), . . . and 82Pn of the same type.

The inverting circuit 82 includes transistors 82N1, 82N2 (not shown), . . . and 82Nn of another type. In some embodiments, the transistors 82P1, 82P2, . . . and 82Pn can be a p-type MOSFET. In some embodiments, the transistors 82N1, 82N2, . . . and 82Nn can be an n-type MOSFET. The number "n" is a positive integer.

Similar to the inverting circuit 80, the inverting circuit 82 includes a stack-gate structure. That is, the gate terminals of the transistors 82P1, 82P2, . . . and 82Pn are connected together, and the gate terminals of the transistors 82N1, 82N2, . . . and 82Nn are connected together. In addition, the gate terminals of the transistors 82P1, 82P2, . . . and 82Pn are connected to the gate terminals of the transistors 82N1, 82N2, . . . and 82Nn.

The inverting circuit 82 includes an input terminal 82_IN and an output terminal 82_OUT. In the operations of the inverting circuit 82, a delay may occur when signals are transmitted from the input terminal 82_IN to the output terminal 82_OUT. Therefore, the inverting circuit 82 can be used as a delay unit. In some embodiments, the inverting circuits 8$i$1, 8$i$2, 8$i$3 and 8$i$4 shown in FIG. 5 can be implemented using the inverting circuit 82.

The inverting circuit 82 including a stack-gate structure can have a significantly-reduced flicker noise. The stack-gate structure of the inverting circuit 82 can reduce the flicker noise of a ring oscillator. A ring oscillator that includes a delay unit implemented with a stack-gate structure can have a significantly-reduced flicker noise. An experiment result shows that an inverting circuit that includes a stack-gate structure can have a significantly-reduced noise current spectral density (Sid, A$^2$/Hz).

Figure 7A:
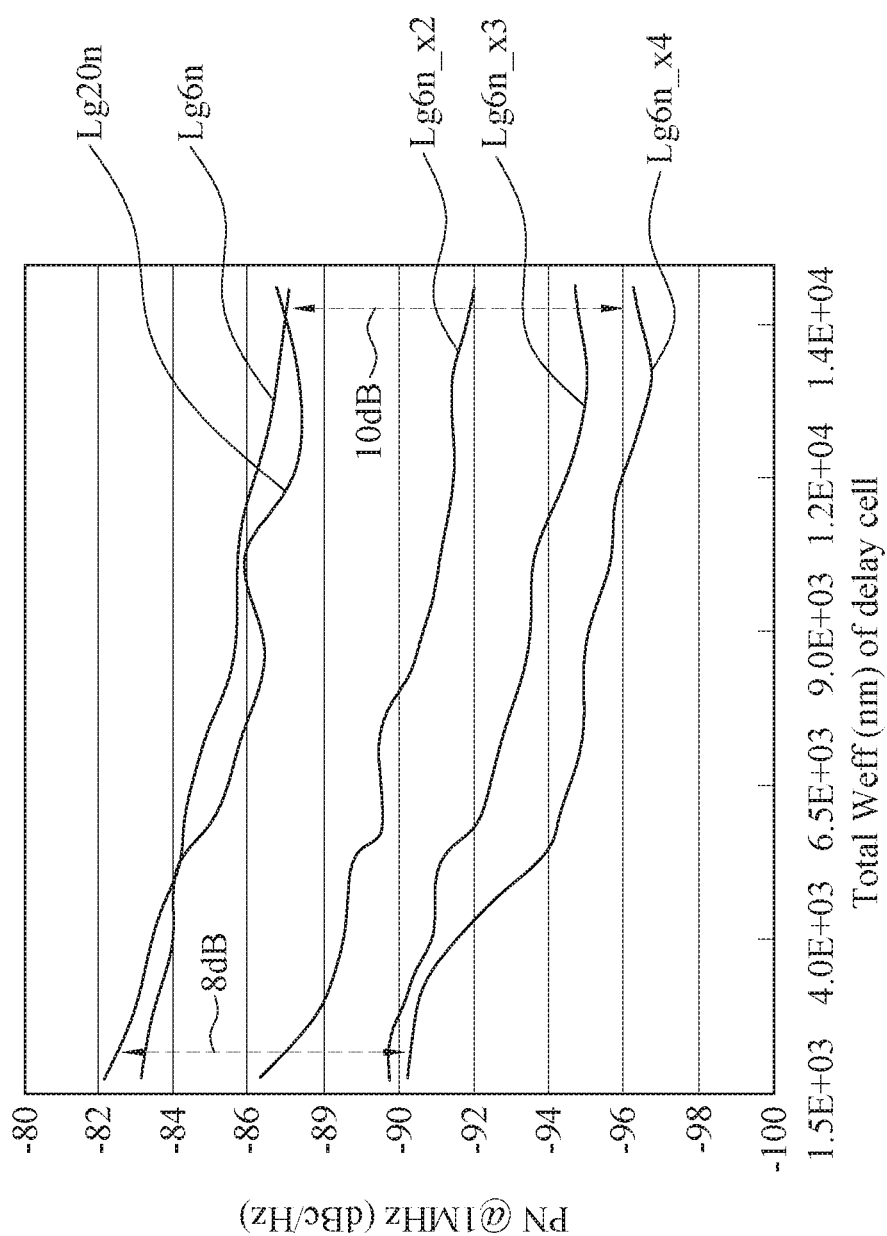
FIG. 7A illustrates a diagram including the phase noises (PN) of the oscillator shown in FIG. 4, in accordance with some embodiments of the present disclosure.

FIG. 7A illustrates a diagram including the phase noises (PN) of the oscillator shown in FIG. 4, in accordance with some embodiments of the present disclosure. The horizontal axis is the effective gate width (Weff) of each of the delay units 8D$_1$, 8D$_2$, 8D$_3$ and 8D$_4$, in the unit of nanometers (nm).

The vertical axis is the phase noise of the oscillator 200 shown in FIG. 4, measured at 1 MHz offset from the center of the operating frequency 3 GHz of the oscillator 200. The phase noise is expressed in dBc per Hz, in which dBc refers to decibels relative to the carrier. The dBc is the power ratio of a signal to a carrier signal, expressed in the unit of decibels.

FIG. 7A includes five curves labeled as "Lg6n," "Lg6n_x2," "Lg6n_x3," "Lg6n_x4," and "Lg20n."

The curve labeled as "Lg6n" is obtained under a condition wherein the delay units 8D$_1$, 8D$_2$, 8D$_3$ and 8D$_4$ of the oscillator 200 do not adopt a stack-gate structure, and the transistors for implementing the delay units 8D$_1$, 8D$_2$, 8D$_3$ and 8D$_4$ each have a gate channel length of 6 nm.

The curve labeled as "Lg20n" is obtained under a condition wherein the delay units 8D$_1$, 8D$_2$, 8D$_3$ and 8D$_4$ of the oscillator 200 do not adopt a stack-gate structure, and the transistors for implementing the delay units 8D$_1$, 8D$_2$, 8D$_3$ and 8D$_4$ each have a gate channel length of 20 nm.

The curve labeled as "Lg6n_x2" is obtained under a condition wherein each of the delay units 8D$_1$, 8D$_2$, 8D$_3$ and 8D$_4$ of the oscillator 200 is implemented using a level-2 stack-gate structure. For example, the inverting circuit 80 shown in FIG. 6A includes a level-2 stack-gate structure, in which the gate terminals of the two transistors 80P1 and 80P2 of the same type are connected together. The level-2 stack-gate structure can also mean that the inverting circuit 80 includes two transistors 80N1 and 80N2 of the same type while their gate terminals are connected together. In addition, the curve labeled as "Lg6n_x2" is obtained under a condition wherein the transistors for implementing the delay units $8D_1$, $8D_2$, $8D_3$ and $8D_4$ each have a gate channel length of 6 nm.

The curve labeled as "Lg6n_x3" is obtained under a condition wherein each of the delay units $8D_1$, $8D_2$, $8D_3$ and $8D_4$ of the oscillator 200 is implemented using a level-3 stack-gate structure. For example, the inverting circuit 82 shown in FIG. 6B may include a level-3 stack-gate structure if the number "n" is selected to be 3. In addition, the curve labeled as "Lg6n_x3" is obtained under a condition wherein the transistors for implementing the delay units $8D_1$, $8D_2$, $8D_3$ and $8D_4$ each have a gate channel length of 6 nm.

The curve labeled as "Lg6n_x4" is obtained under a condition wherein each of the delay units $8D_1$, $8D_2$, 8D; and $8D_4$ of the oscillator 200 is implemented using a level-4 stack-gate structure. For example, the inverting circuit 82 shown in FIG. 6B may include a level-4 stack-gate structure if the number "n" is selected to be 4. In addition, the curve labeled as "Lg6n_x4" is obtained under a condition wherein the transistors for implementing the delay units $8D_1$, $8D_2$, $8D_3$ and $8D_4$ each have a gate channel length of 6 nm.

Referring to FIG. 7A, the phase noise of the curves labeled as "Lg6n," "Lg6n_x2," "Lg6n_x3," "Lg6n_x4," and "Lg20n" in general decrease as the effective gate width (Weff) increases. In addition, a delay unit implemented using transistors that have a greater gate channel length can in general have a lower phase noise. For example, the curve labeled as "Lg20n" in general has a lower phase noise than the curve labeled as "Lg6n."

Nevertheless, it should be noted that a delay unit implemented using a stack-gate structure can have significant improvements on the phase noise. The improvements brought by the stack-gate structure may outperform the increase of the effective gate width. The improvements brought by the stack-gate structure may outperform the increase of the gate channel length.

For example, when the curve labeled as "Lg6n_x2" is obtained, the oscillator 200 is implemented using level-2 stack-gate structure, in which the transistors have an effective gate channel length of 12 nm (i.e., 6 nm×2). However, the curve labeled as "Lg6n_x2" can have a phase noise much lower than the curve labeled as "Lg20n," in which the transistors for implementing the oscillator 200 have a gate channel length of 12 nm.

In addition, the benefits of a stack-gate structure can be even more apparent if the level of the stack-gate structure increases (that is, the number of gate-connected transistors increases). Comparing the curve labeled as "Lg6n" with the curve labeled as "Lg6n_x4," the phase noise of the curve labeled as "Lg6n_x4" can be approximately 8 dB to 10 dB lower than that of the curve labeled as "Lg6n."

Figure 7B:
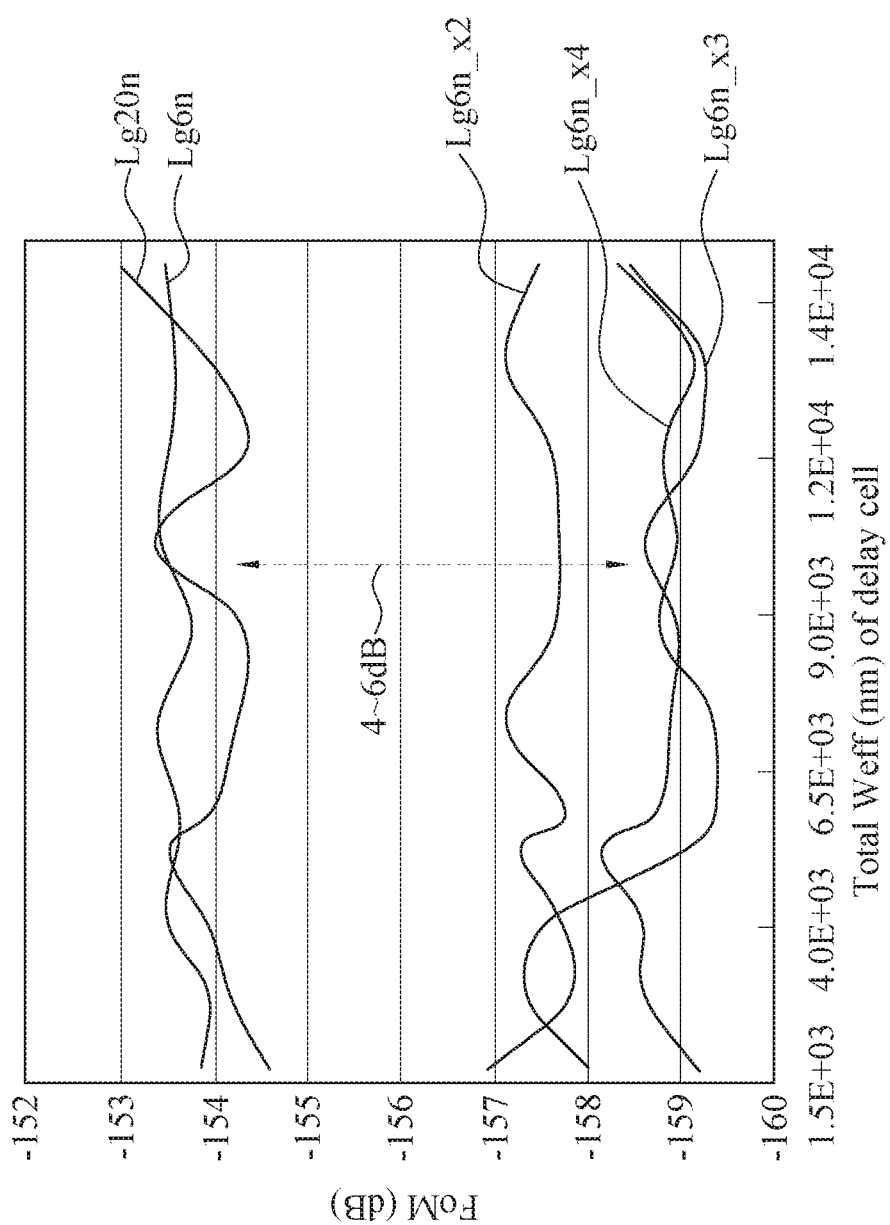
FIG. 7B illustrates a diagram including the figure of merit (FoM) of the oscillator shown in FIG. 4, in accordance with some embodiments of the present disclosure.

FIG. 7B illustrates a diagram including the figure of merit (FoM) of the oscillator shown in FIG. 4, in accordance with some embodiments of the present disclosure. The horizontal axis is the effective gate width (Weff) of each of the delay units $8D_1$, $8D_2$, $8D_3$ and $8D_4$, in the unit of nanometers (nm).

The vertical axis is the FoM of the oscillator 200 shown in FIG. 4, measured at an operating frequency 3 GHz of the oscillator 200. The FoM is expressed in dB. The FoM of an oscillator can be expressed in accordance with the equation below:

$$FoM = L(\Delta\omega) - 20\log_{10}\left[\frac{\omega_0}{\Delta\omega}\right] + 10\log_{10}\left[\frac{P}{1\text{ mW}}\right] \quad \text{(equation 6)}$$

The function L in the above equation is the phase noise of the oscillator 200. The parameter $\omega_0$ refers to the operating frequency of the oscillator 200. The parameter $\Delta\omega$ refers to an offset from the center of the operating frequency of the oscillator 200. The parameter P refers to the power consumption of the oscillator 200. In general, an oscillator with a lower FoM can have better performance.

FIG. 7B includes five curves labeled as "Lg6n," "Lg6n_x2," "Lg6n_x3," "Lg6n_x4," and "Lg20n." The curves labeled as "Lg6n," "Lg6n_x2," "Lg6n_x3," "Lg6n_x4," and "Lg20n" can be obtained under the conditions as discussed in accordance with FIG. 7A.

As shown in FIG. 7B, the FoM improvements brought by the stack-gate structure may outperform the increase of the effective gate width. The FoM improvements brought by the stack-gate structure may outperform the increase of the gate channel length. Comparing the curve labeled as "Lg6n" with the curve labeled as "Lg6n_x4," the FoM of the curve labeled as "Lg6n_x4" can be approximately 4 dB to 6 dB lower than that of the curve labeled as "Lg6n."

Figure 8A:
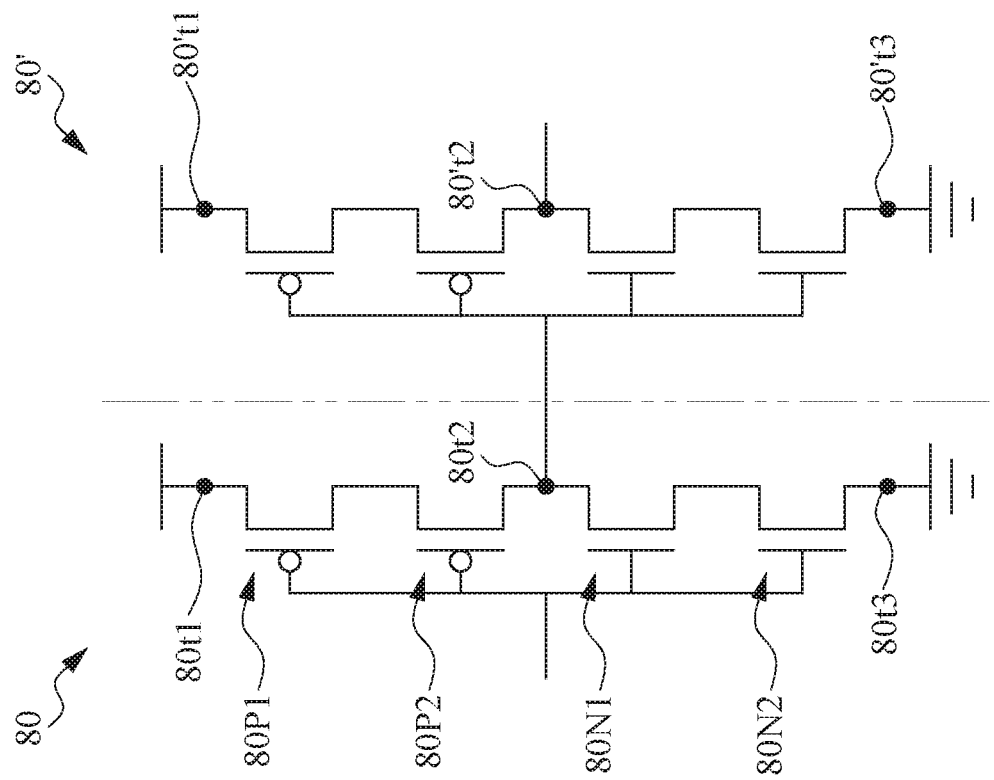
FIG. 8A illustrates a schematic view of two connected inverting circuits, in accordance with some embodiments of the present disclosure.

FIG. 8A illustrates a schematic view of two connected inverting circuits, in accordance with some embodiments of the present disclosure. FIG. 8A shows an inverting circuit 80 connected to an inverting circuit 80'. The inverting circuit 80 includes transistors 80P1 and 80P2 of the same type. The inverting circuit 80 includes transistors 80N1 and 80N2 of another type. The inverting circuit 80' includes components and structures identical to those of the inverting circuit 80. The inverting circuit 80 includes a stack-gate structure. The inverting circuit 80' includes a stack-gate structure.

The inverting circuit 80 includes terminals 80$t$1, 80$t$2 and 80$t$3. The terminals 80$t$1, 80$t$2 and 80$t$3 can also be referred to as pinout terminals, contacts, or contact terminals in the subsequent paragraphs of the present disclosure. The inverting circuit 80 can be connected to external circuits/components through the terminals 80$t$, 80$t$2 and 80$t$3. The inverting circuit 80' includes terminals 80'$t$1, 80'$t$2 and 80'$t$3. The inverting circuit 80' can be connected to external circuits/components through the terminals 80'$t$1, 80'$t$2 and 80'$t$3.

Figure 8B:
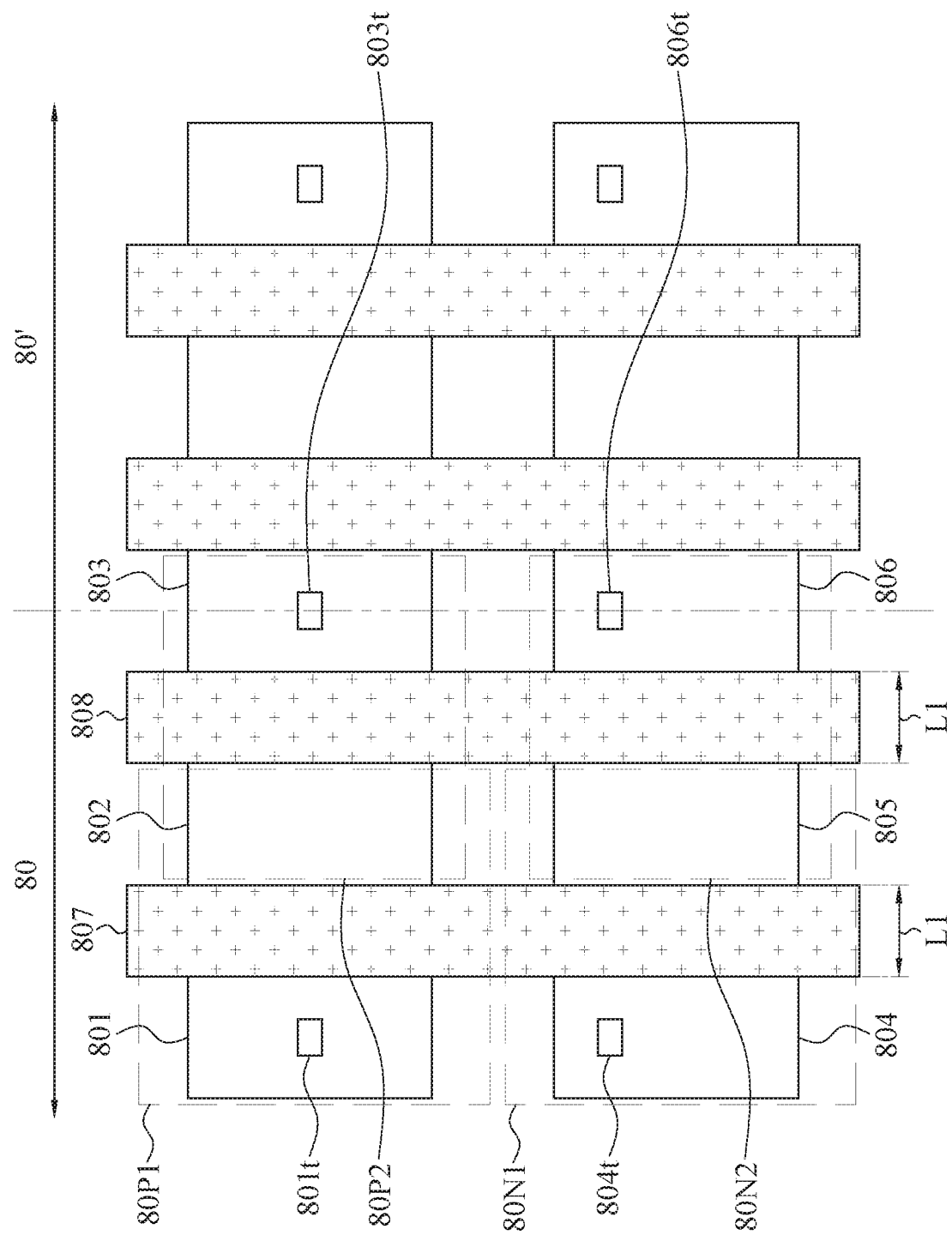
FIG. 8B illustrates a schematic view of the layout of two connected inverting circuits, in accordance with some embodiments of the present disclosure.

FIG. 8B illustrates a schematic view of the layout of two connected inverting circuits, in accordance with some embodiments of the present disclosure. FIG. 8B illustrates a layout illustration of the connected inverting circuits 80 and 80' as shown in FIG. 8A.

Referring to FIG. 8B, the transistor 80P1 includes a region 801, a region 802 and a region 807. The regions 801 and 802 can be the source/drain region of the transistor 80P1. The region 807 can be the gate region of the transistor 80P1. The transistor 80P1 includes a pinout terminal 801$t$. The pinout terminal 801$t$ is located within the region 801 and in contact with the region 801.

The region 807 can be disposed between the regions 801 and 803. The region 807 can be sandwiched by the regions 801 and 803.

The transistor 80P2 includes the region 802, a region 803 and a region 808. The regions 802 and 803 can be the source/drain region of the transistor 80P2. The region 808 can be the gate region of the transistor 80P2. The transistor 80P2 includes a pinout terminal 803$t$. The pinout terminal 803$t$ is located within the region 803 and in contact with the region 803.

The region 802 can be disposed between the regions 807 and 808. The region 802 can be sandwiched by the regions 807 and 808. The region 802 can be a portion of the transistor 80P1, and also be a portion of the transistor 80P2. The transistors 80P1 and 80P2 can be deemed as being connected together because they share a common region (i.e., the region 802). The transistors 80P1 and 80P2 are connected as a stack-gate structure. The region 802 is devoid of a pinout terminal.

The transistor 80P1 can be connected to external circuit/components through the pinout terminals 801*t*. The transistor 80P2 can be connected to external circuit/components through the pinout terminals 803*t*.

Referring again to FIG. 8B, the transistor 80N1 includes a region 804, a region 805 and the region 807. The regions 804 and 805 can be the source/drain region of the transistor 80N1. The region 807 can be the gate region of the transistor 80N1. The transistor 80N1 includes a pinout terminal 804*t*. The pinout terminal 804*t* is located within the region 804 and in contact with the region 804.

The region 807 can be disposed between the regions 804 and 805. The region 807 can be sandwiched by the regions 804 and 805.

The transistor 80N2 includes the region 805, a region 806 and the region 808. The regions 805 and 806 can be the source/drain region of the transistor 80N2. The region 808 can be the gate region of the transistor 80N2. The transistor 80N2 includes a pinout terminal 806*t*. The pinout terminal 806*t* is located within the region 806 and in contact with the region 806.

The region 805 can be disposed between the regions 807 and 808. The region 805 can be sandwiched by the regions 807 and 808. The region 805 can be a portion of the transistor 80N1, and also be a portion of the transistor 80N2. The transistors 80N1 and 80N2 can be deemed as being connected together because they share a common region (i.e., the region 805). The transistors 80N1 and 80N2 are connected as a stack-gate structure. The region 805 is devoid of a pinout terminal.

The transistor 80N1 can be connected to external circuit/components through the pinout terminals 804*t*. The transistor 80N2 can be connected to external circuit/components through the pinout terminals 806*t*.

The transistor 80P1 and the transistor 80N1 can be deemed as being connected together because they share a common region (i.e., the region 807). The gate region of the transistor 80P1 can be connected to the gate region of the transistor 80N1. The transistor 80P2 and the transistor 80N2 can be deemed as being connected together because they share a common region (i.e., the region 808). The gate region of the transistor 80P2 can be connected to the gate region of the transistor 80N2.

Referring to FIG. 8B, the gate channel length of each of the transistors 80P1 and 80P2 is L1. The effective gate channel length of the transistors 80P1 and 80P2 is L1×2. The gate channel length of each of the transistors 80N1 and 80N2 is L1. The effective gate channel length of the transistors 80N1 and 80N2 is L1×2.

The stack-gate structure provides benefits in terms of the layout of the semiconductor devices. The layout of the stack-gate structure, as shown in FIG. 8B, uses multiple gate regions having shorter lengths (i.e., L1) to achieve an effective greater gate length. A transistor having smaller gate region can also have a smaller overall size. Therefore, the stack-gate structure provides an approach to achieve lower noise without sacrificing the area of a semiconductor wafer. In addition, the stack-gate structure is also beneficial in advancing FinFET technologies, which suffer from less usable channel length device selection.

FIG. 9A illustrates a schematic view of a plurality of connected inverting circuits, in accordance with some embodiments of the present disclosure.

FIG. 9A shows inverting circuits 82, 82' and 82" connected together. Each of the inverting circuits 82, 82' and 82" has a stack-gate structure. Although FIG. 9A depicts merely three inverting circuits, it can be contemplated that an arbitrary number of inverting circuits can be configured to be connected together.

Figure 9B:
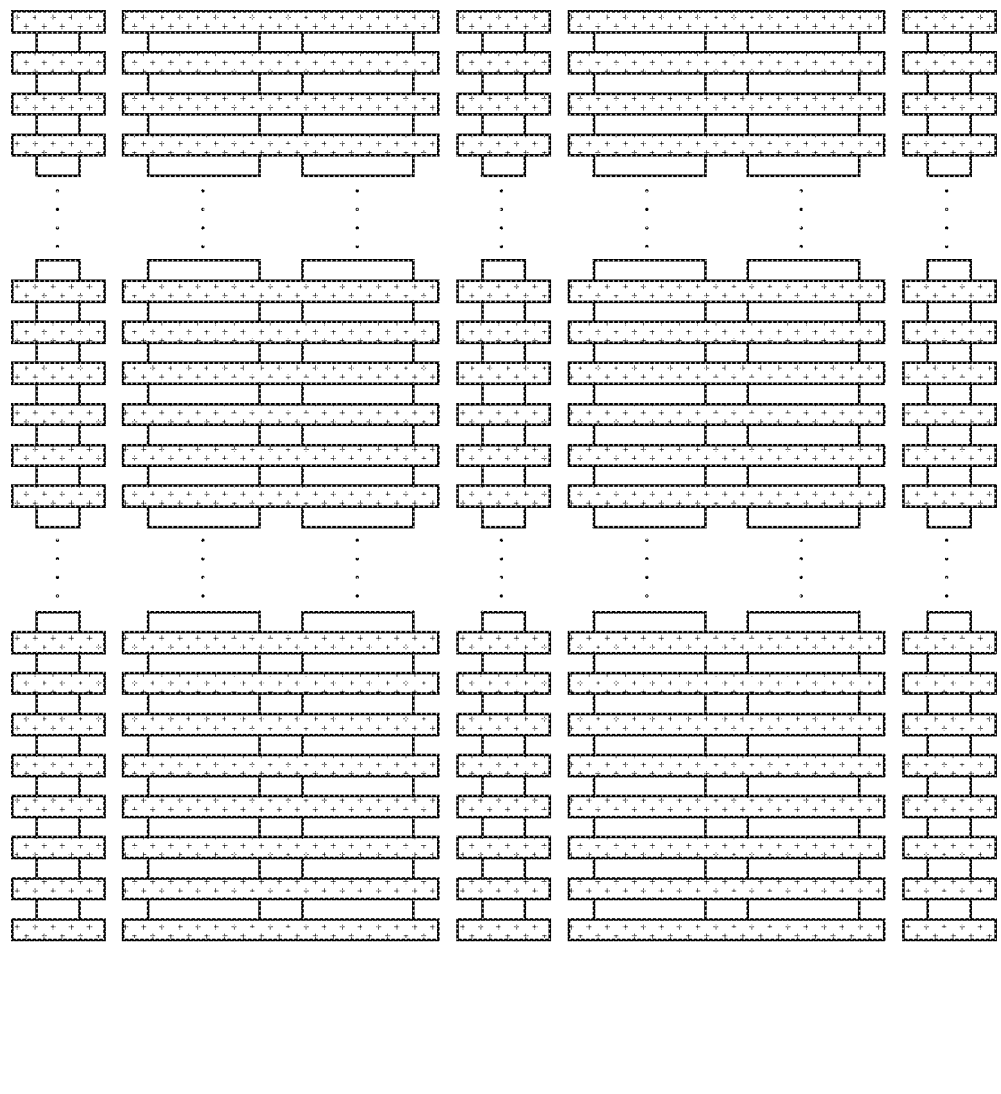
FIG. 9B illustrates a schematic view of the layout of a plurality of connected inverting circuits, in accordance with some embodiments of the present disclosure.

FIG. 9B illustrates a schematic view of the layout of a plurality of connected inverting circuits, in accordance with some embodiments of the present disclosure. FIG. 9B illustrates a layout 90 of a plurality of inverting circuits. The layout 90 can correspond to a layout of an arbitrary number of inverting circuits that are connected as a stack-gate structure.

As shown in FIG. 9B, the layout 90 includes regularly arranged gate regions and source/drain regions. The regularly arranged regions are beneficial to the semiconductor manufacturing process. For example, since the regularly arranged regions of the stack-gate structure can be compact and uniform, the yield rate of the semiconductor manufacturing process can be increased. In addition, a lower density gradient effect and lower mismatch between transistors can also be expected.

The stack-gate structure disclosed in the present disclosure can be widely applied to the field of oscillators. For example, the stack-gate structure can be applied to TX/RX local oscillator for RF mixer up/down conversions. In some embodiments, the stack-gate structure can be applied to oscillator core (VCO or CCO) in phase lock loops (PLLs). In some embodiments, the stack-gate structure can be applied to low noise clock source for high-speed data converters. In some embodiments, the stack-gate structure can be applied to a clock distribution network such as a clock tree application.

Some embodiments of the present disclosure provide an oscillation circuit. The oscillation circuit includes a first inverting circuit. The first inverting circuit comprises a first transistor of a first type and a second transistor of the first type, wherein a gate terminal of the first transistor is connected to a gate terminal of the second transistor, and a source terminal of the first transistor is connected to a drain terminal of the second transistor.

Some embodiments of the present disclosure provide a semiconductor device for an oscillation circuit. The semiconductor device comprises a first source/drain region sandwiched by a first gate region and a second gate region, wherein the first source/drain region is devoid of a pinout terminal.

Some embodiments of the present disclosure provide a method of manufacturing a semiconductor device for an oscillation circuit. The method comprises: forming a first source/drain region; forming a first gate region adjacent to a first side of the first source/drain region; and forming a second gate region adjacent to a second side of the first source/drain region. Wherein the first source/drain region is devoid of a pinout terminal.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An oscillation circuit, comprising:
   a first inverting circuit having a first transistor of a first type, a second transistor of the first type, a third transistor of a second type, and a fourth transistor of the second type; wherein
   the first transistor and the third transistor share a first gate region;
   the second transistor and the fourth transistor share a second gate region;
   the first transistor and the second transistor share a first source/drain region devoid of a pinout terminal and sandwiched by the first gate region and the second gate region; and
   the third transistor and the fourth transistor share a second source/drain region devoid of a pinout terminal and sandwiched by the first gate region and the second gate region.

2. The oscillation circuit of claim 1, wherein a gate terminal of the first transistor is connected to a gate terminal of the second transistor, and a gate terminal of the third transistor is connected to a gate terminal of the fourth transistor.

3. The oscillation circuit of claim 2, wherein a drain terminal of the third transistor is connected to a source terminal of the second transistor, and a source terminal of the third transistor is connected to a drain terminal of the fourth transistor.

4. The oscillation circuit of claim 1, further comprising a second inverting circuit, wherein the second inverting circuit has a fifth transistor of the first type and a sixth transistor of the first type, and a gate terminal of the fifth transistor is connected to a gate terminal of the sixth transistor.

5. The oscillation circuit of claim 4, wherein the second inverting circuit further comprises a seventh transistor of a second type and an eighth transistor of the second type, and a gate terminal of the seventh transistor is connected to a gate terminal of the eighth transistor.

6. The oscillation circuit of claim 5, wherein a drain terminal of the seventh transistor is connected to a source terminal of the sixth transistor, and a source terminal of the seventh transistor is connected to a drain terminal of the eighth transistor.

7. The oscillation circuit of claim 4, wherein the aspect ratio of the first transistor is different from the aspect ratio of the fifth transistor.

8. The oscillation circuit of claim 4, wherein the aspect ratio of the fifth transistor is in a range of 0.25~0.5 times the aspect ratio of the first transistor.

9. The oscillation circuit of claim 4, wherein the first inverting circuit is connected between a first node and a second node and the second inverting circuit is connected between the second node and a third node.

10. The oscillation circuit of claim 9, further comprising a third inverting circuit connected between the third node and a fourth node and a fourth inverting circuit connected between the second node and the third node.

11. The oscillation circuit of claim 10, wherein an output terminal of the first inverting circuit is connected to an output terminal of the second inverting circuit and an input terminal of the fourth inverting circuit.

12. The oscillation circuit of claim 10, wherein an output terminal of the third inverting circuit is connected to an input terminal of the second inverting circuit and an output terminal of the fourth inverting circuit.

13. The oscillation circuit of claim 1, wherein the first inverting circuit further comprises a number N of transistors of the first type connected between the first transistor and the second transistor, wherein
   a gate terminal of each of the number N of transistors are electrically connected with each other;
   two adjacent transistors of the number N of transistors share a common source/drain region, the common source/drain region being devoid of a pinout terminal; and
   the number N is equal to or greater than two.

14. A semiconductor device for an inverting circuit in an oscillation circuit, comprising:
   a first source/drain region sandwiched by a first gate region and a second gate region; and
   a second source/drain region sandwiched by the first gate region and the second gate region; wherein
   the first source/drain region is devoid of a pinout terminal, and
   the second source/drain region is devoid of a pinout terminal.

15. The semiconductor device of claim 14, further comprising a third source/drain region adjacent to the first gate region, the third source/drain region comprising a first pinout terminal.

16. The semiconductor device of claim 15, further comprising a fourth source/drain region adjacent to the second gate region, the fourth source/drain region comprising a second pinout terminal.

17. The semiconductor device of claim 14, wherein the second source/drain region and the first source/drain region are of different conductive types.

18. The semiconductor device of claim 14, wherein the first gate region and the second gate region extend in parallel along a direction from the first source/drain region to the second source/drain region.

19. A method of manufacturing a semiconductor device for an oscillation circuit, comprising:
   forming a first source/drain region of a first conductive type and a second source/drain region of a second conductive type different than the first conductive type;
   forming a first gate region adjacent to a first side of both the first source/drain region and the second source/drain region;
   forming a second gate region adjacent to a second side of both the first source/drain region and the second source/drain region;
   wherein the first source/drain region is devoid of a pinout terminal, and
   the first gate region and the second gate region extend in parallel along a direction from the first source/drain region to the second source/drain region.

20. The method of claim 19, further comprising:
   forming a third source/drain region adjacent to the first gate region, and
   forming a first pinout terminal in contact with the third source/drain region.

21. The method of claim 19, further comprising:
   forming a third source/drain region adjacent to the second gate region, and forming a second pinout terminal in contact with the third source/drain region.

* * * * *